(12) United States Patent
Kim et al.

(10) Patent No.: US 11,107,796 B2
(45) Date of Patent: Aug. 31, 2021

(54) SEMICONDUCTOR MODULE INCLUDING MEMORY STACK HAVING TSVS

(71) Applicant: SK hynix Inc., Gyeonggi-do (KR)

(72) Inventors: Myoung-Seo Kim, Gyeonggi-do (KR);
Seung-Yong Lee, Gyeonggi-do (KR);
Young-Pyo Joo, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 13 days.

(21) Appl. No.: 16/586,321

(22) Filed: Sep. 27, 2019

(65) Prior Publication Data
US 2020/0111764 A1 Apr. 9, 2020

(30) Foreign Application Priority Data
Oct. 5, 2018 (KR) .......................... 10-2018-0118916

(51) Int. Cl.
*H01L 25/065* (2006.01)
*H01L 23/48* (2006.01)
*H01L 23/498* (2006.01)
*H01L 23/495* (2006.01)

(52) U.S. Cl.
CPC ........ *H01L 25/0657* (2013.01); *H01L 23/481* (2013.01); *H01L 23/49513* (2013.01); *H01L 23/49816* (2013.01); *H01L 2224/13025* (2013.01); *H01L 2224/16145* (2013.01); *H01L 2225/06541* (2013.01); *H01L 2924/15311* (2013.01)

(58) Field of Classification Search
CPC ....... H01L 25/0657; H01L 2225/06541; H01L 2225/06544; H01L 2225/06513; H01L 2225/06517; H01L 25/18; H01L 25/0652; H01L 23/3128; H01L 23/48; H01L 23/5386; H01L 23/5385; H01L 23/49816; H01L 2224/16145; H01L 2224/13025; G11C 5/025
See application file for complete search history.

(56) References Cited

U.S. PATENT DOCUMENTS

| 8,343,804 B2 | 1/2013 | Coteus et al. |
| 2011/0063930 A1 | 3/2011 | Baker |
| 2019/0198489 A1* | 6/2019 | Kim ........................ H01L 25/18 |

* cited by examiner

*Primary Examiner* — Jasmine J Clark
(74) *Attorney, Agent, or Firm* — IP & T Group LLP

(57) ABSTRACT

A semiconductor module includes a module board, an interposer on the module board, and a processing device and a memory stack that are disposed side by side on the interposer, wherein the memory stack includes a base die, and a memory die on the base die, wherein the memory die includes an outer bank region, a central TSV region, first and second inner bank regions, and a first non-central TSV region, wherein the central TSV region is disposed between the outer bank region and the second inner bank region, and the first non-central TSV region is disposed between the first inner bank region and the second inner bank region.

27 Claims, 15 Drawing Sheets

SEMICONDUCTOR MODULE INCLUDING MEMORY STACK HAVING TSVS

CROSS-REFERENCE TO RELATED APPLICATIONS

The present application claims priority to Korean Patent Application No. 10-2018-0118916, filed on Oct. 5, 2018, which is incorporated herein by reference in its entirety.

BACKGROUND

1. Field

The present disclosure relates generally to a semiconductor module and, more particularly, to a semiconductor module including memory stacks having Through-Silicon Vias (TSVs).

2. Description of the Related Art

Much attention is being paid to developing a semiconductor module with a high bandwidth for next-generation high-performance computers. Generally, the proposed semiconductor modules include a host processing device and a plurality of stacked memory devices (i.e., memory stacks). The memory stacks may use TSVs for communicating with the processing device. Typically, the TSVs may be arranged in a common region and do not allow for differentiation between frequently accessed and not frequently accessed data. As a result, the efficiency of the memory stacks is generally low.

SUMMARY

Exemplary embodiments of the present invention are directed to a semiconductor memory device, a memory stack and a semiconductor module exhibiting improved efficiency and performance.

Exemplary embodiments of the present invention are directed to a semiconductor memory device, a memory stack and a semiconductor module having a short data path for frequently accessed data so that frequently accessed data may be stored in a relatively close memory bank.

Exemplary embodiments of the present invention are directed to a semiconductor memory device, a memory stack and a semiconductor module having a relatively long data path and a relatively short data path.

It is noted that the present invention is not limited to the described exemplary embodiments, and that other embodiments or variations of the described exemplary embodiments may be clearly understood by those skilled in the art from the following description.

In accordance with an embodiment of the present disclosure, a semiconductor module includes a module board and an interposer on the module board. The semiconductor module further includes a processing device and a memory stack disposed side by side on the interposer. The memory stack includes a base die and a memory die on the base die, wherein the memory die includes an outer bank region, a central TSV region, first and second inner bank regions, and a first non-central TSV region. The central TSV region is disposed between the outer bank region and the second inner bank region, and the first non-central TSV region is disposed between the first inner bank region and the second inner bank region.

The first inner bank region may be disposed adjacent to a side of the memory die, and the second inner bank region may be disposed adjacent to the central TSV region.

The memory die may further include a second non-central TSV region and a third inner bank region which are disposed between the second inner bank region and the first non-central TSV region, and the second non-central TSV region may be disposed adjacent to the second inner bank region, and the third inner bank region may be disposed adjacent to the first non-central TSV region.

An electrical path from the processing device to the first non-central TSV region may be shorter than an electrical path from the processing device to the second non-central TSV region.

An electrical path from the processing device to the central TSV region may be longer than an electrical path from the processing device to the first non-central TSV region.

The base die may include a circuit occupied region, a central TSV occupied region, first and second PHY occupied regions, and a first non-central TSV occupied region, wherein the central TSV occupied region is disposed between the circuit occupied region and the second PHY occupied region, and the first non-central TSV occupied region is disposed between the first PHY occupied region and the second PHY occupied region.

The memory stack may include a central TSV, a first non-central TSV and a second non-central TSV which vertically penetrate the memory die, wherein the central TSV occupied region, the central TSV region and the central TSV vertically overlap one another, the first non-central TSV occupied region, and the first non-central TSV region and the first non-central TSV vertically overlap one another.

In accordance with another embodiment of the present disclosure, a semiconductor module includes a module board, an interposer on the module board. A processing device and a memory stack are mounted side by side on the interposer. The memory stack includes a plurality of memory dies stacked on a base die, and a plurality of TSVs penetrating the memory dies, wherein the base die includes a circuit occupied region, a central TSV occupied region, a non-central TSV occupied region and a PHY occupied region. A first distance from the processing device to the circuit occupied region is greater than a second distance from the processing device to the central TSV occupied region. A third distance from the processing device to the non-central TSV occupied region is smaller than the second distance. A fourth distance from the processing device to the PHY occupied region is smaller than the second distance and greater than the third distance.

Each of the memory dies may include a central TSV region vertically overlapping the central TSV occupied region, and a non-central TSV region vertically overlapping the non-central TSV occupied region.

Each of the memory dies may further include an outer bank region including an outer bank that vertically overlaps the circuit occupied region; and an inner bank region including an inner bank that vertically overlaps the PHY occupied region.

The memory stack may include central TSVs disposed in the central TSV region and non-central TSVs disposed in the non-central TSV region, and the central and non-central TSVs may vertically penetrate the base die and the memory dies.

A first electrical path that is electrically coupled to the outer bank through the central TSVs from the processing device may be longer than a second electrical path that is electrically coupled to the inner bank through the non-central TSVs from the processing device.

The interposer may include a processor mounting region in which the processing device is mounted and a memory stack mounting region in which the memory stack is mounted, and the memory stack mounting region may include an inward memory ball grid array and an outward memory ball grid array, and a distance from the processor mounting region to the inward memory ball grid array may be greater than a distance from the processor mounting region to the outward memory ball grid array.

The inward memory ball grid array may vertically overlap the PHY occupied region, and the outward memory ball grid array may vertically overlap the circuit occupied region.

In accordance with another embodiment of the present disclosure, a semiconductor module includes a module board, and an interposer on the module board. A processing device and a memory stack are disposed side by side on the interposer. The memory stack includes a base die, memory dies stacked on the base die, and central and non-central TSVs that vertically penetrate the memory dies. At least one of the memory dies includes outer and inner banks, and a first electrical path that is electrically coupled to the outer bank through the central TSV from the processing device is longer than a second electrical path that is electrically coupled to the inner bank through the non-central TSV from the processing device.

The central TSV may be disposed between the outer bank and the inner bank, and the inner bank may be disposed between the central TSV and the non-central TSV.

The central TSV may be disposed adjacent to a virtual central line bisecting the memory dies, and the non-central TSV may be spaced apart from the virtual central line so as to be disposed relatively close to the processing device.

The inner bank may include a first inner bank disposed between the non-central TSV and the processing device, and a second inner bank disposed between the central TSV and the non-central TSV.

An electrical path that is coupled to the first inner bank through the non-central TSV from the processing device may be shorter than an electrical path that is coupled to the second inner bank through the non-central TSV from the processing device.

An electrical path that is coupled to the first inner bank through the non-central TSV from the processing device may have the same distance as an electrical path that is coupled to the second inner bank through the non-central TSV from the processing device.

These and other features and advantages of the present invention will become apparent to those with ordinary skill in the art of the present invention from the following detailed description in conjunction with the accompanying drawings.

DETAILED DESCRIPTION

Figure 1:
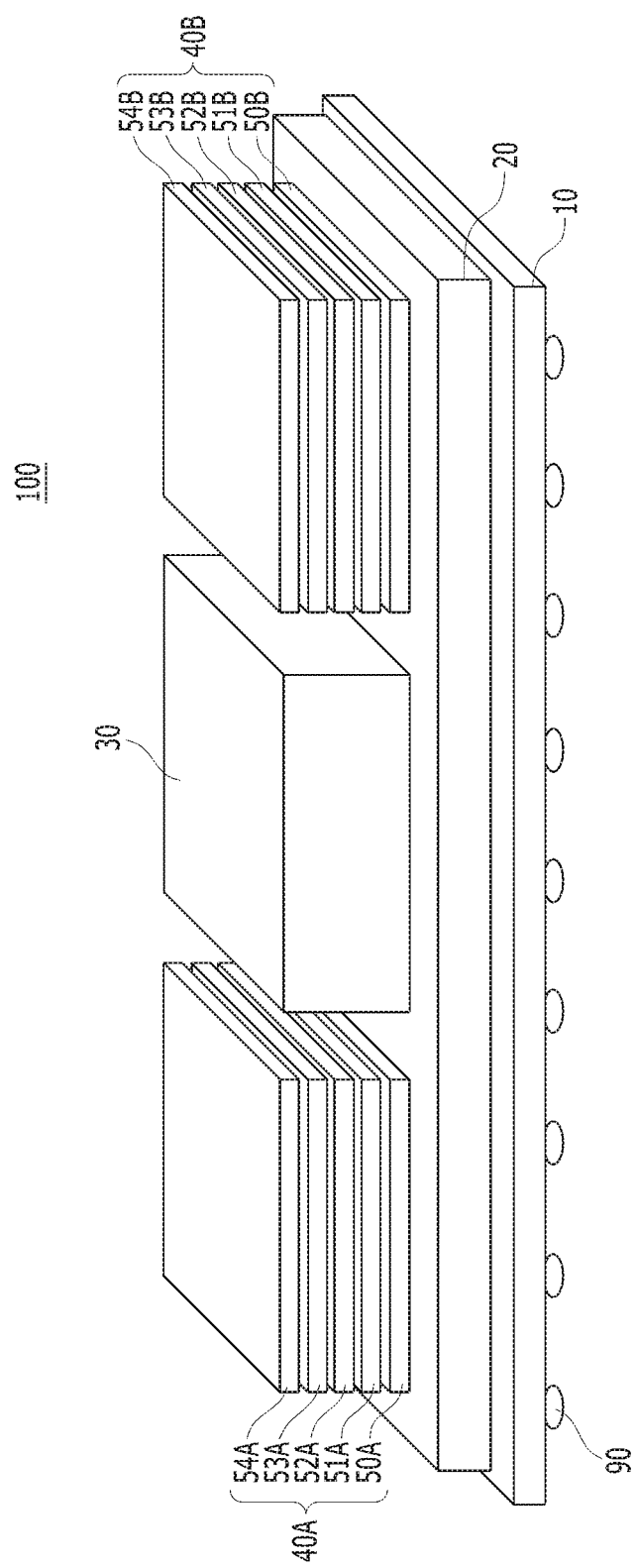
FIG. 1 is a perspective view of a schematic illustration of a semiconductor module in accordance with an embodiment of the present disclosure.

Various embodiments of the present disclosure will now be described more fully hereinafter with reference to the accompanying drawings. The present invention may, however, be embodied in different forms and should not be construed as limited to the embodiments set forth herein. Rather, these embodiments are provided so that this disclosure is thorough and complete and fully conveys the scope of the inventive concept to one skilled in the art. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two or more elements, whether directly or indirectly connected/coupled, may be wired or wireless, unless stated or the context indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

The same reference numerals are used to denote the same items of the drawings throughout the specification. Therefore, although the same reference numerals or similar reference numerals are not mentioned or described in the drawings, they may be described with reference to other drawings. Further, even if the reference numerals are not shown, they may be described with reference to other drawings.

The drawings are not necessarily to scale and, in some instances, proportions may have been exaggerated in order to clearly illustrate features of the embodiments.

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention.

Figure 2:
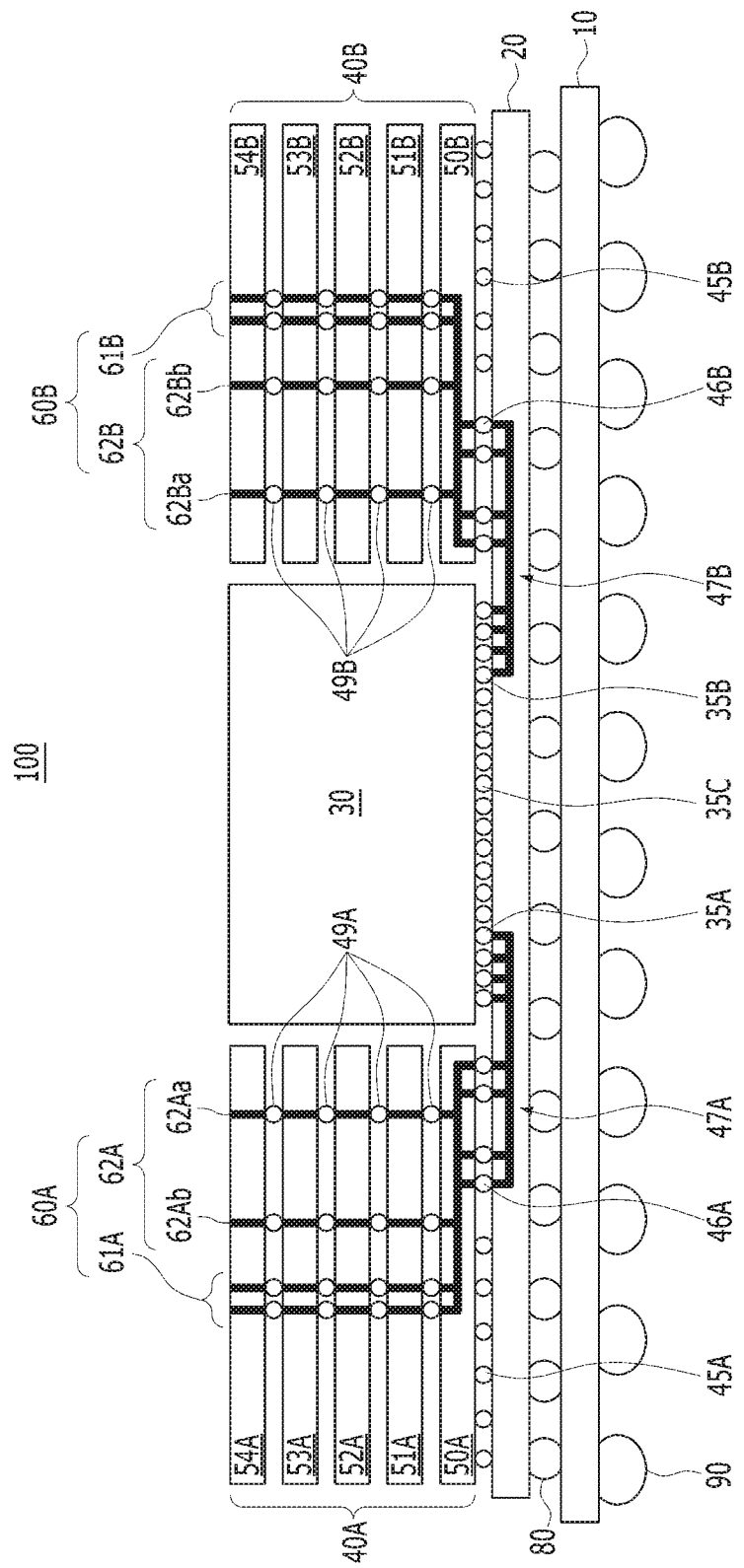
FIG. 2 is a longitudinal sectional view of a schematic illustration of a semiconductor module in accordance with an embodiment of the present disclosure.

FIG. 1 is a perspective view of a schematic illustration of a semiconductor module 100 in accordance with an embodiment, and FIG. 2 is a longitudinal sectional view of a schematic illustration of the semiconductor module 100.

Referring to FIGS. 1 and 2, the semiconductor module 100 may include a module board 10, an interposer 20 mounted on the module board 10, a processing device 30 and memory stacks 40A and 40B. The processing device 30 and memory stacks 40A and 40B are mounted side by side on the interposer 20.

The module board 10 may, for example, include a printed circuit board (PCB). A plurality of outer bumps 90 may be disposed on a bottom surface of the module board 10, and a plurality of inner bumps 80 may be disposed on a top surface of the module board 10. For example, the plurality of outer bumps 90 may be electrically coupled to an outer system board, main board, or module board. The plurality of outer bumps 90 may include solder bumps or metallic bumps. The bumps may, for example, have the shape of a ball. The inner bumps may be smaller than the outer bumps, however, the invention is not limited in this way. The plurality of inner bumps 80 may electrically couple the module board 10 to the interposer 20. The plurality of inner bumps 80 may include solder bumps or metallic bumps. The interposer 20 may have a shape of a flat board on which the processing device 30 and the memory stacks 40A and 40B are mounted. The interposer may electrically couple the processing device 30 to the memory stacks 40A and 40B.

The processing device 30 may be any suitable processing device including, for example, any one of a micro-processing unit (MPU), a central processing unit (CPU), a general processing unit (GPU), a host processing unit (HPU), a chip set and a controller. For example, the processing device 30 may transmit clock signals and/or command signals to the memory stacks 40A and 40B, and transmit and receive data signals to and from the memory stacks 40A and 40B. In addition, the processing device 30 may transmit and receive electrical signals to and from an outer processor, a power supply or an input/output device through the interposer 20 and the module board 10.

The memory stacks 40A and 40B may include a first memory stack 40A disposed on a first side (e.g., left side) of the processing device 30 and a second memory stack 40B disposed on the other side (e.g., right side) of the processing device 30. The memory stacks 40A and 40B may include first and second base dies 50A and 50B and a plurality of memory dies 51A to 54A and 51B to 54B stacked on the base dies 50A and 50B, respectively. FIG. 1 illustrates, as an example, that four memory dies 51A to 54A and 51B to 54B are stacked in the first and second memory stacks 40A and 40B, respectively. The number of memory dies may vary depending on design.

The base dies 50A and 50B may include a test logic circuit such as design for test (DFT), a joint test action group (JTAG) and a memory built-in self-test (MBIST), a signal interface circuit such as PHY, and so on.

The memory dies 51A to 54A and 51B to 54B may include a memory device such as a DRAM, an MRAM, a PcRAM, an ReRAM, and a NAND flash. The memory dies 51A to 54A and 51B to 54B may include through-silicon vias (TSVs) 60A and 60B, respectively. The TSVs 60A and 60B may vertically penetrate the memory dies 51A to 54A and 51B to 54B, respectively. The TSVs 60A and 60B may include central TSVs 61A and 61B and non-central TSVs 62A and 62B, respectively. The central TSVs 61A and 61B may penetrate central regions of the memory stacks 40A and 40B, respectively. The non-central TSVs 62A and 62B may penetrate non-central regions of the memory stacks 40A and 40B, respectively. For example, the central region may be a region adjacent to a virtual central vertical line to divide the memory stack 40A or 40B into two parts, and the non-central region may be a region spaced apart from the virtual central vertical line. The distances from the processing device 30 to the central TSVs 61A and 61B may be greater than those from the processing device 30 to the non-central TSVs 62A and 62B. The electrical paths from the processing device 30 to the non-central TSVs 62A and 62B may be shorter than those from the processing device 30 to the central TSVs 61A and 61B. The non-central TSVs 62A and 62B may include first non-central TSVs 62Aa and 62Ba disposed relatively close to the outer sides of the memory stacks 40A and 40B and second non-central TSVs 62Ab and 62Bb disposed relatively close to the central regions or the virtual central vertical lines of the memory stacks 40A and 40B, respectively. In an embodiment, the first non-central TSVs 62Aa and 62Ba may be located closest to the processing device 30, the second non-central TSVs 62Ab and 62Bb may be located closer to the processing device 30 than the central TSVs 61A and 61B but farther away than the first non-central TSVs 62Aa and 62Ba, and the central TSVs 61A and 61B may be located farthest from the processing device 30. The distances from the processing device 30 to the first non-central TSVs 62Aa and 62Ba may be smaller than those from the processing device 30 to the second non-central TSVs 62Ab and 62Bb. The electrical paths through the central TSVs 61A and 61B from the processing device 30 may be longer than those through the non-central TSVs 62A and 62B from the processing device 30.

Processor micro-bumps 35A, 35B, and 35C may be disposed between the interposer 20 and the processing device 30. The processor micro-bumps 35A, 35B, and 35C may include first processor micro-bumps 35A for being electrically coupled to the first base die 50A of the first memory stack 40A, second processor micro-bumps 35B for being electrically coupled to the second base die 50B of the second memory stack 40B, and central processor micro-bumps 35C for being electrically coupled to an outer (or external) electronic device through the interposer 20 and the module board 10. The processor micro-bumps 35A, 35B, and 35C may include solder bumps or metallic bumps. The first processor micro-bumps 35A may be disposed closer to the first memory stack 40A than the second and third processor micro-bumps 35B and 35C, and the second processor micro-bumps 35B may be disposed closer to the second memory stack 40B than the first and third micro-bumps 35A and 35C.

First memory micro-bumps 45A and 46A may be disposed between the interposer 20 and the first base die 50A of the first memory stack 40A, and second memory micro-bumps 45B and 46B may be disposed between the interposer 20, and the second base die 50B of the second memory stack 40B. The first memory micro-bumps 45A and 46A may include first outward memory micro-bumps 45A and first inward memory micro-bumps 46A, and the second memory micro-bumps 45B and 46B may include second outward memory micro-bumps 45B and second inward memory micro-bumps 46B. The first and second outward memory micro-bumps 45A and 45B may be electrically coupled to an outer electronic device through the interposer 20, the inner bumps 80, the module board 10, and the outer bumps 90. The first inward memory micro-bumps 46A may be electrically coupled to the first processor micro-bumps 35A through a first inner connection 47A inside the interposer 20, and the second inward memory micro-bumps 46B may be electrically coupled to the second processor micro-bumps 35B through a second inner connection 47B inside the interposer 20. The first and second inward memory micro-bumps 46A and 46B may be disposed closer to the processing device 30 than the first and second outward memory micro-bumps 45A and 45B, respectively. In other words, the distances from the processing device 30 to the first and second outward memory micro-bumps 45A and 45B may be greater than those from the processing device 30 to the first and second inward memory micro-bumps 46A and 46B, respectively.

Inter-die micro-bumps 49A and 49B may be disposed among the memory dies 51A to 54A and 51B to 54B, that is, the TSVs 60A and 60B, respectively. The inter-die micro-bumps 49A and 49B may electrically couple the TSVs 60A and 60B. The inter-die micro-bumps 49A and 49B may include solder bumps or metallic bumps.

The semiconductor module 100 in accordance with the present embodiment may have relatively short electrical paths through the non-central TSVs 62A and 62B and relatively long electrical paths through the central TSVs 61A and 61B, from the processing device 30 to the interiors of the memory dies 51A to 54A and 51B to 54B of the memory stacks 40A and 40B.

Figure 3:
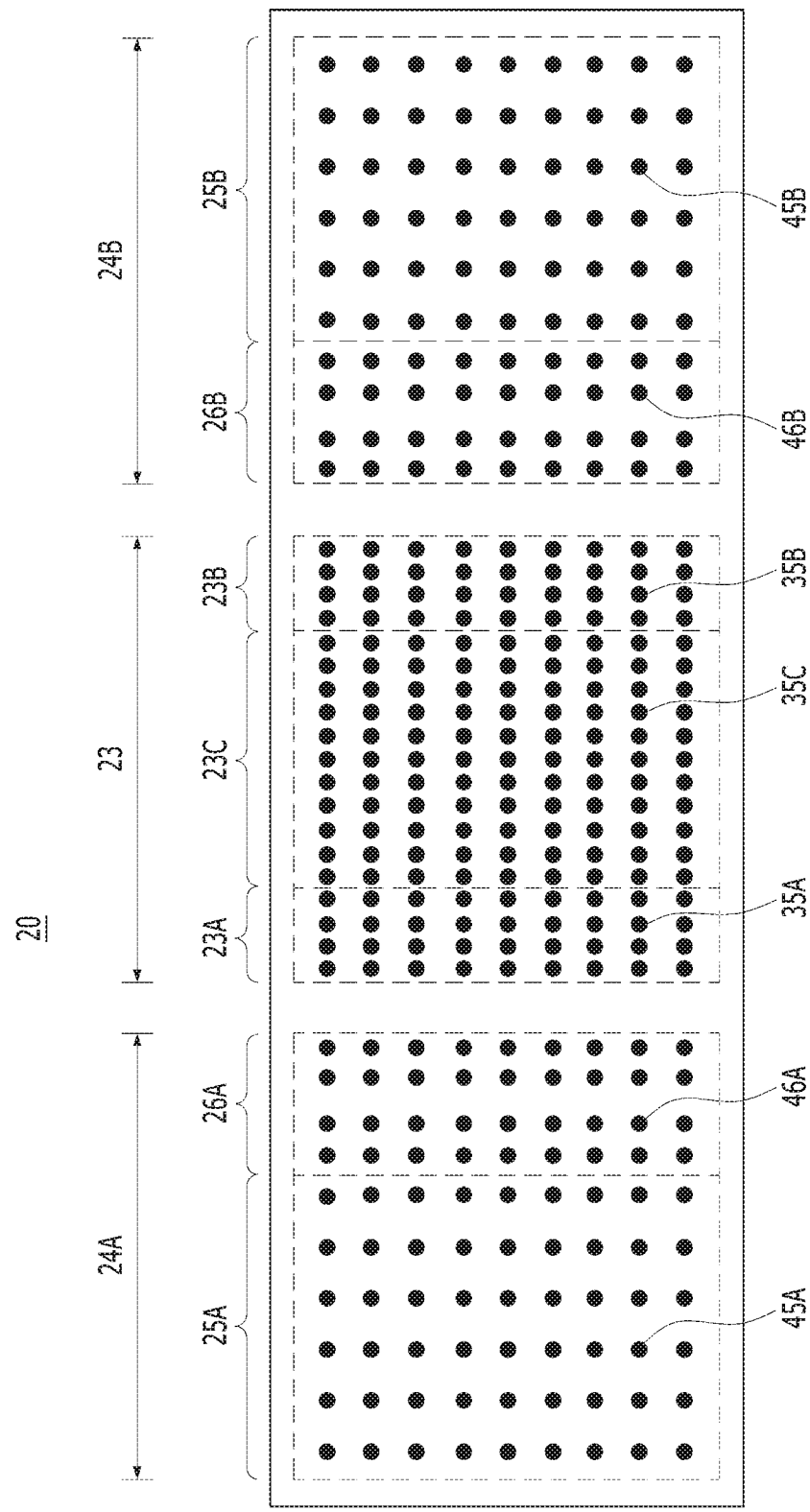
FIG. 3 is a top view of a schematic illustration of a top surface of an interposer in accordance with an embodiment of the present disclosure.

FIG. 3 is a top view of a schematic illustration of a top surface of the interposer 20. For example, FIG. 3 schematically illustrates ball grid arrays of the interposer 20. Referring to FIG. 3, the interposer 20 may include a processing device mounting region 23 and first and second memory stack mounting regions 24A and 24B.

The processing device mounting region 23 may include a first processor ball grid array 23A, a second processor ball grid array 23B and a central processor ball grid array 23C. The first and second processor ball grid arrays 23A and 23B may provide regions in which pads, lands or connectors are formed. The first and second processor micro-bumps 35A and 35B for electrically coupling the processor to the first and second memory stacks 40A and 40B, respectively, may be disposed in the pads, lands, or connectors. The first processor ball grid array 23A may be disposed closer to the first memory stack mounting region 24A than the second and central processor ball grid arrays 23B and 23C, and the second processor ball grid array 23B may be disposed closer to the second memory stack mounting region 24B than the first and central processor ball grid arrays 23A and 23C. The central processor ball grid array 23C may provide a region in which pads, lands or connectors are formed. The central processor micro-bumps 35C may be disposed in the pads, lands, or connectors. The central processor ball grid array 23C may be disposed in a central region of the processing device mounting region 23. For example, the central processor ball grid array 23C may be disposed between the first processor ball grid array 23A and the second processor ball grid array 23B.

The first and second memory stack mounting regions 24A and 24B may include first and second outward memory ball grid arrays 25A and 25B, respectively. Pads, lands, or connectors in which the first and second outward memory micro-bumps 45A and 45B are disposed may be formed in the first and second outward memory ball grid arrays 25A and 25B. In addition, the first and second memory stack mounting regions 24A and 24B may include first and second inward memory ball grid arrays 26A and 26B, respectively. Pads, lands, or connectors in which the first and second inward memory micro-bumps 46A and 46B are disposed may be formed in the first and second inward memory ball grid arrays 26A and 26B. The first and second inward memory ball grid arrays 26A and 26B may be disposed closer to the processing device mounting region 23 than the first and second outward memory ball grid arrays 25A and 25B. In other words, the distances from the processing device mounting region 23 to the first and second outward memory ball grid arrays 25A and 25B may be greater than those from the processing device mounting region 23 to the first and second inward memory ball grid arrays 26A and 26B. In the drawing, the micro-bumps 35A, 35B, 35C, 45A, 45B, 46A, and 46B may be pads, lands, or connectors.

Figure 4:
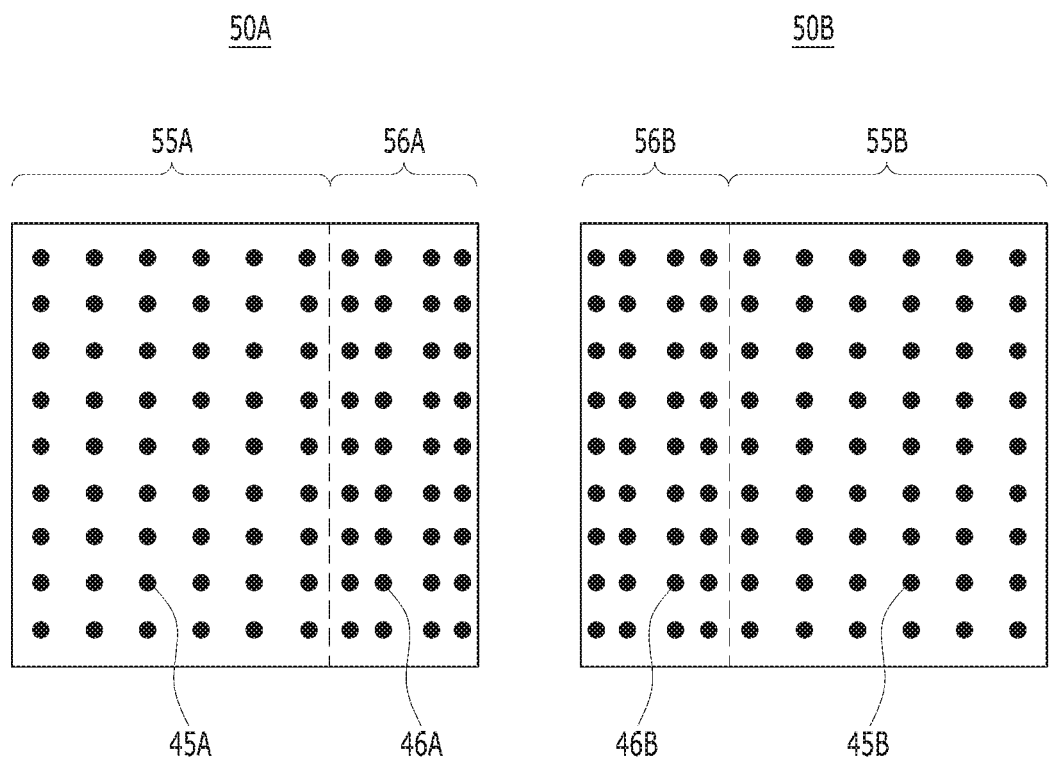
FIG. 4 is a bottom view of a schematic illustration of base dies in accordance with an embodiment of the present disclosure.

FIG. 4 is a bottom view of a schematic illustration of the first and second base dies 50A and 50B of the first and second memory stacks 40A and 40B in accordance with the present embodiment. For example, FIG. 4 illustrates ball grid arrays of bottom surfaces of the first and second base dies 50A and 50B. Referring to FIG. 4, the bottom surfaces of the first and second base dies 50A and 50B may include first and second outward memory ball grid arrays 55A and 55B, respectively. Pads, lands, or connectors in which the first and second outward memory micro-bumps 45A and 45B are disposed may be formed in the first and second outward memory ball grid arrays 55A and 55B. In addition, the bottom surfaces of the first and second base dies 50A and 50B may include first and second inward memory ball grid arrays 56A and 56B, respectively. Pads, lands, or connectors in which the first and second inward memory micro-bumps 46A and 46B are disposed may be formed in the first and second inward memory ball grid arrays 56A and 56B. The first and second inward memory ball grid arrays 56A and 56B may be disposed closer to the processing device 30 than the first and second outward memory ball grid arrays 55A and 55B. In other words, the distances from the processing device 30 to the first and second outward memory ball grid arrays 55A and 55B may be greater than those from the processing device 30 to the first and second inward memory ball grid arrays 56A and 56B. In the figure, the micro-bumps 45A, 45B, 46A and 46B may be pads, lands or connectors.

Figure 5:
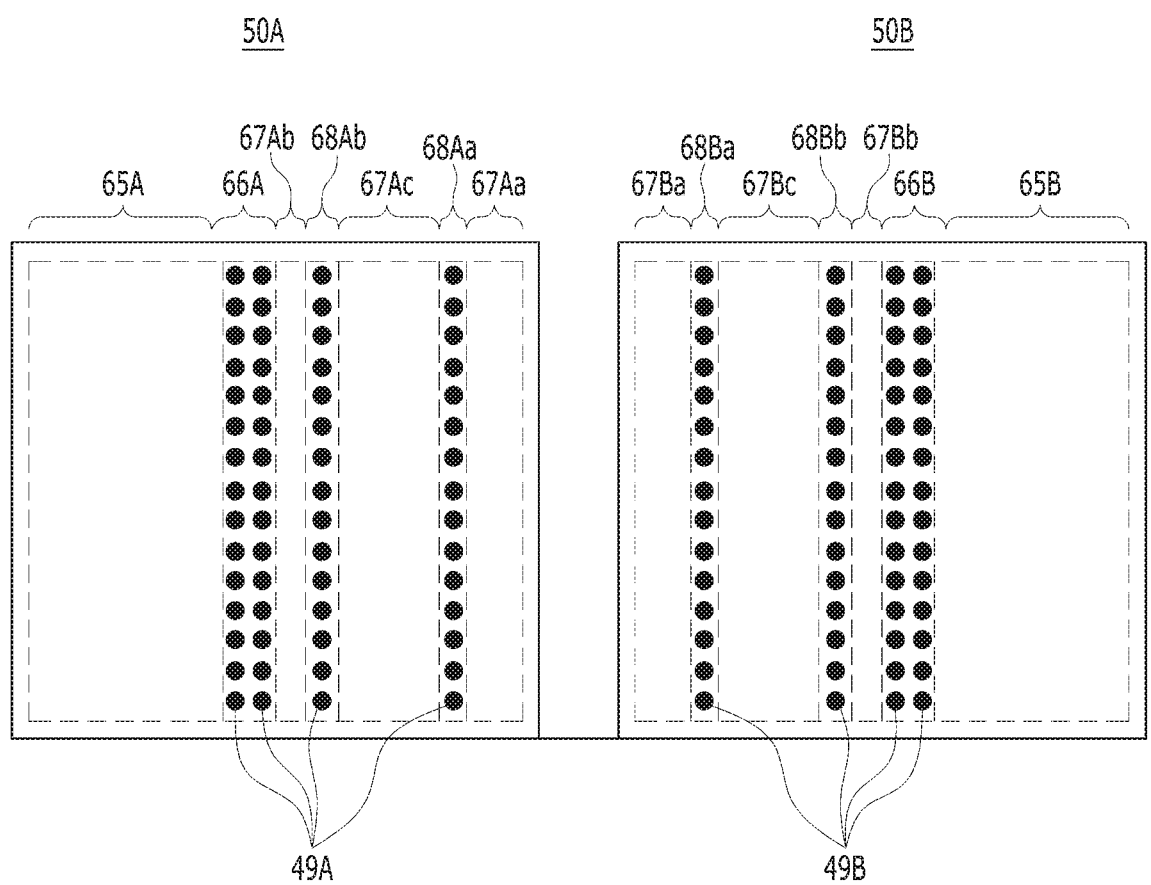
FIG. 5 is a top view of a schematic illustration of base dies in accordance with an embodiment of the present disclosure.

FIG. 5 is a top view of a schematic illustration of the first and second base dies 50A and 50B of the first and second memory stacks 40A and 40B in accordance with the present embodiment. For example, FIG. 5 illustrates ball grid arrays of top surfaces of the first and second base dies 50A and 50B. Referring to FIG. 5, the top surfaces of the first and second base dies 50A and 50B may include circuit occupied regions 65A and 65B, central TSV occupied regions 66A and 66B, PHY occupied regions 67Aa to 67Ac and 67Ba to 67Bc, and non-central TSV occupied regions 68Aa, 68Ab and 68Ba, 68Bb, respectively.

The circuit occupied regions 65A and 65B may indicate regions in which a test logic circuit such as a DFT circuit, a JTAG circuit and an MBIST circuit may be disposed. The circuit occupied regions 65A and 65B may be disposed adjacent to outer sides of the first and second base dies 50A and 50B so as to be farthest from the processing device 30.

The central TSV occupied regions 66A and 66B may be disposed adjacent to the respective circuit occupied regions 65A and 65B. In an embodiment, the central TSV occupied regions 66A and 66B may be disposed on or adjacent to virtual central lines bisecting the top surfaces of the first and second base dies 50A and 50B, respectively, in a column direction. In an embodiment, the central TSV occupied regions 66A and 66B may be disposed between the virtual central lines bisecting the top surfaces of the first and second base dies 50A and 50B and the circuit occupied regions 65A and 65B, respectively. Further referring to FIG. 2, the central TSV occupied regions 66A and 66B may be occupied by the central TSVs 61A and 61B, respectively. In other words, the central TSV occupied regions 66A and 66B may vertically overlap the central TSVs 61A and 61B, respectively. The distances from the processing device 30 to the circuit occupied regions 65A and 65B may be greater than those from the processing device 30 to the central TSV occupied regions 66A and 66B.

Further referring to FIGS. 2 and 5, the non-central TSV occupied regions 68Aa, 68Ab and 68Ba, 68Bb may be occupied by the non-central TSVs 62A and 62B, respectively. In other words, the non-central TSV occupied regions 68Aa, 68Ab and 68Ba, 68Bb may vertically overlap the non-central TSVs 62A and 62B, respectively. In an embodiment, further referring to FIGS. 2 and 5, the non-central TSV occupied regions 68Aa, 68Ab and 68Ba, 68Bb may include first non-central TSV occupied regions 68Aa and 68Ba disposed relatively close to the sides of the base dies 50A and 50B to overlap the first non-central TSVs 62Aa and 62Ba, and second non-central TSV occupied regions 68Ab and 68Bb disposed relatively close to the virtual central lines of the memory stacks 40A and 40B to overlap the second non-central TSVs 62Ab and 62Bb.

The PHY occupied regions 67Aa to 67Ac and 67Ba to 67Bc may include first PHY occupied regions 67Aa and 67Ba disposed between the sides of the base dies 50A and 50B and the first non-central TSV occupied regions 68Aa and 68Ba so as to be close to the processing device 30, second PHY occupied regions 67Ab and 67Bb disposed between the central TSV occupied regions 66A and 66B and the second non-central TSV occupied regions 68Ab and 68Bb, and third PHY occupied regions 67Ac and 67Bc disposed between the first non-central TSV occupied regions 68Aa and 68Ba and the second non-central TSV occupied regions 68Ab and 68Bb.

The distances from the processing device 30 to the first PHY occupied regions 67Aa and 67Ba may be smaller than those from the processing device 30 to the second PHY occupied regions 67Ab and 67Bb. The distances from the processing device 30 to the second PHY occupied regions 67Ab and 67Bb may be greater than those from the processing device 30 to the third PHY occupied regions 67Ac and 67Bc. Further referring to FIGS. 2 and 5, the PHY occupied regions 67Aa to 67Ac and 67Ba to 67Bc may overlap the inward memory micro-bumps 46A and 46B.

The inter-die micro-bumps 49A and 49B may be disposed in the central TSV occupied regions 66A and 66B. The inter-die micro-bumps 49A and 49B may electrically couple the central TSVs 61A and 61B, and electrically couple the non-central TSVs 62A and 62B in the non-central TSV occupied regions 68Aa, 68Ab and 68Ba, 68Bb. The inter-die micro-bumps 49A and 49B may be pads, lands or connectors.

Figure 6A:
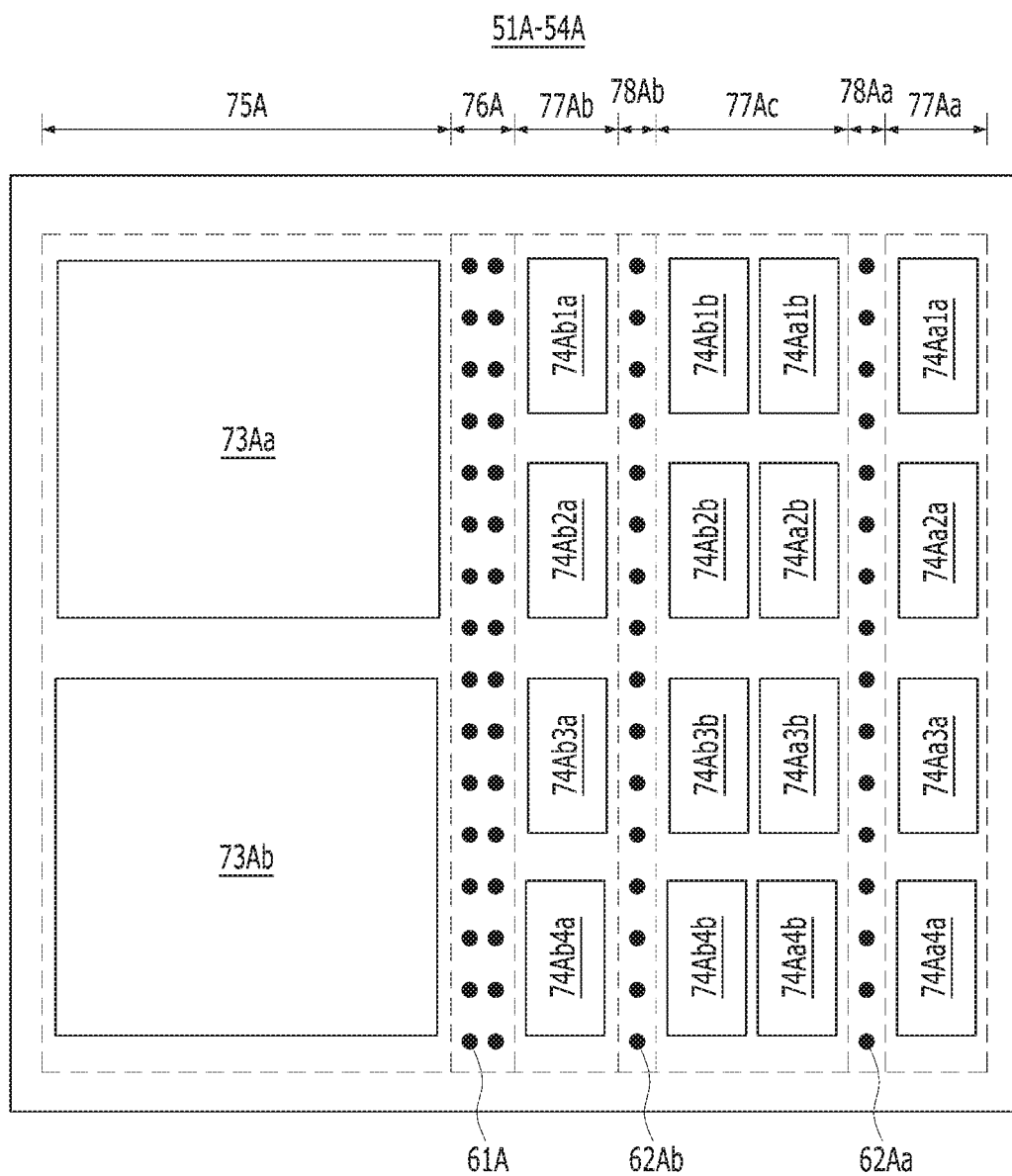
FIGS. 6A and 6B are internal block layouts of memory dies in accordance with an embodiment of the present disclosure.
Figure 6B:
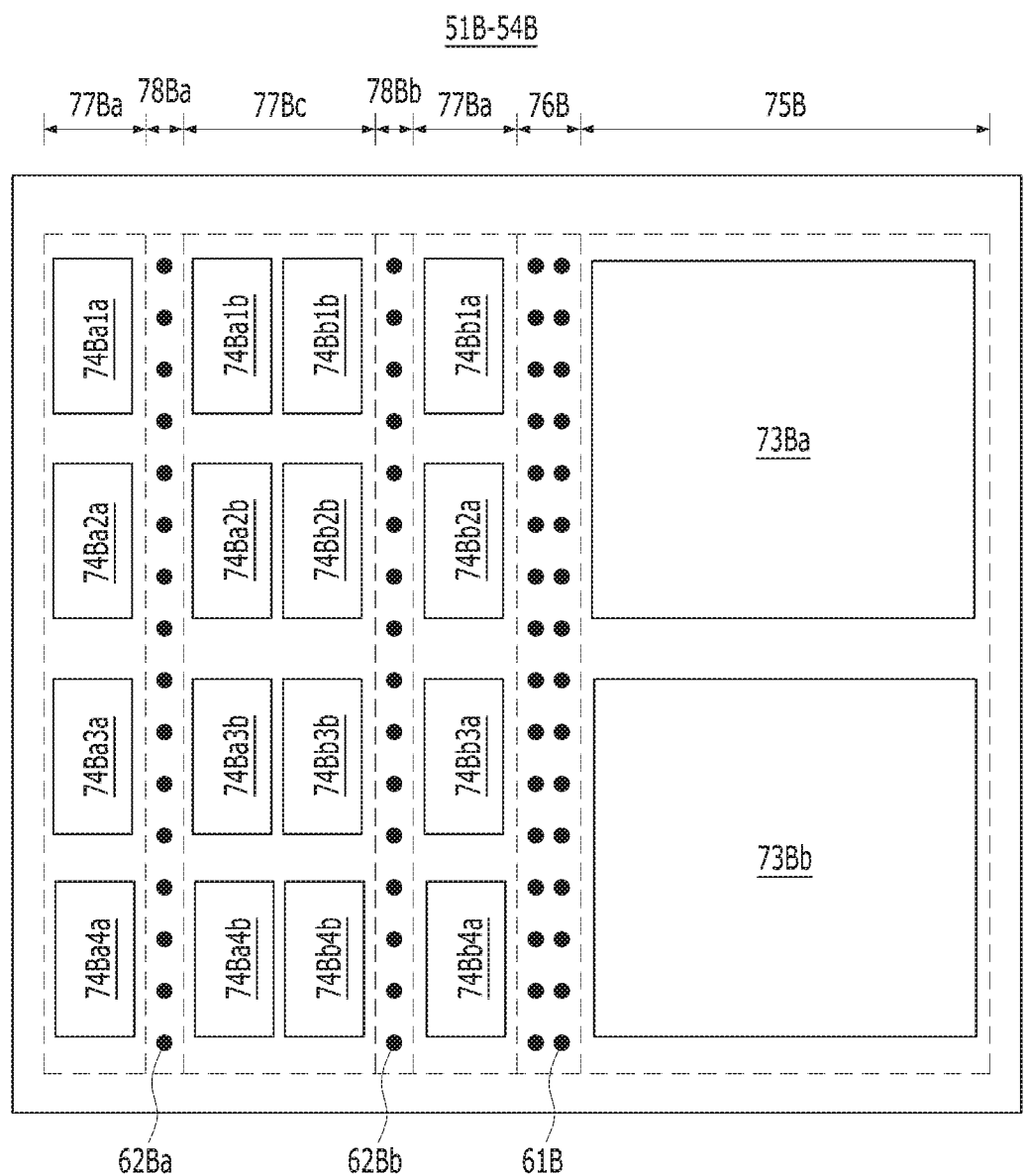

FIGS. 6A and 6B are internal block layouts of the memory dies 51A to 54A and 51B to 54B in accordance with an embodiment of the present disclosure. Referring to FIGS. 6A and 6B, each of the memory dies 51A to 54A and each of the memory dies 51B to 54B may include outer bank regions 75A and 75B overlapping the circuit occupied regions 65A and 65B of the base dies 50A and 50B, central TSV regions 76A and 76B overlapping the central TSV occupied regions 66A and 66B, inner bank regions 77Aa to 77Ac and 77Ba to 77Bc overlapping the PHY occupied regions 67Aa to 67Ac and 67Ba to 67Bc, and non-central TSV regions 78Aa, 78Ab and 78Ba, 78Bb overlapping the non-central TSV occupied regions 68Aa, 68Ab, and 68Ba, 68Bb, respectively. The non-central TSV regions 78Aa, 78Ab and 78Ba, 78Bb may include first non-central TSV regions 78Aa and 78Ba relatively closer to outer sides of the memory dies 51A to 54A and 51B to 54B, respectively, than second non-central TSV regions 78Ab and 78Bb so as to overlap the first non-central TSVs 62Aa and 62Ba and the first non-central TSV occupied regions 68Aa and 68Ba. The non-central TSV regions 78Aa, 78Ab and 78Ba, 78Bb may include the second non-central TSV regions 78Ab and 78Bb relatively closer to central regions of the memory dies 51A to 54A and 51B to 54B, respectively, than the first non-central TSV regions 78Aa and 78Ba so as to overlap the second non-central TSVs 62Ab and 62Bb and the second non-central TSV occupied regions 68Ab and 68Bb. The central TSV regions 76A and 76B may be disposed adjacent to the respective outer bank regions 75A and 75B. In an embodiment, the central TSV regions 76A and 76B may be disposed adjacent to virtual vertical central lines bisecting the memory dies 51A to 54A and 51B to 54B. In addition, the central TSV regions 76A and 76B may be disposed between the virtual vertical central lines bisecting the memory dies 51A to 54A and 51B to 54B and the outer bank regions 75A and 75B. Further referring to FIGS. 6A and 6B, the non-central TSV regions 78Aa, 78Ab and 78Ba, 78Bb may include first non-central TSV regions 78Aa and 78Ba disposed relatively closer to the sides of the memory dies 51A to 54A and 51B to 54B, respectively, than the second non-central TSV regions 78Ab and 78Bb so as to overlap the first non-central TSVs 62Aa and 62Ba. The non-central TSV regions 78Aa, 78Ab and 78Ba, 78Bb may include the second non-central TSV regions 78Ab and 78Bb disposed relatively closer to the virtual vertical central lines bisecting the memory dies 51A to 54A and 51B to 54B, respectively, than the first non-central TSV regions 78Aa and 78Ba. so as to overlap the second non-central TSVs 62Ab and 62Bb.

Outer banks 73Aa, 73Ab and 73Ba, 73Bb may be disposed in the outer bank regions 75A and 75B, respectively. Each of the outer banks 73Aa, 73Ab and 73Ba, 73Bb may be formed as one or more banks. Memory cell blocks may be disposed in the outer banks 73Aa, 73Ab and 73Ba, 73Bb, and include memory cells and logic circuits. The central TSVs 61A and 61B may be disposed in the central TSV regions 76A and 76B. The outer banks 73Aa, 73Ab and 73Ba, 73Bb may communicate with an external device through the central TSVs 61A and 61B.

Inner banks 74Aa1a to 74Ab4b and 74Ba1a to 74Bb4b may be disposed in the inner bank regions 77Aa to 77Ac and 77Ba to 77Bc, respectively. The inner banks 74Aa1a to 74Ab4b and 74Ba1a to 74Bb4b may include first inner banks 74Aa1*a*, 74Aa1*b*, 74Aa2*a*, 74Aa2*b*, 74Aa3*a*, 74Aa3*b*, 74Aa4*a*, 74Aa4*b* and 74Ba1*a*, 74Ba1*b*, 74Ba2*a*, 74Ba2*b*, 74Ba3*a*, 74Ba3*b*, 74Ba4*a*, 74Ba4*b* sharing the first non-central TSVs 62Aa and 62Ba, respectively, and second inner banks 74Ab1*a*, 74Ab1*b*, 74Ab2*a*, 74Ab2*b*, 74Ab3*a*, 74Ab3*b*, 74Ab4*a*, 74Ab4*b* and 74Bb1*a*, 74Bb1*b*, 74Bb2*a*, 74Bb2*b*, 74Bb3*a*, 74Bb3*b*, 74Bb4*a*, 74Bb4*b* sharing the second non-central TSVs 62Ab and 62Bb, respectively. For example, the inner bank regions 77Aa to 77Ac and 77Ba to 77Bc may include first inner bank regions 77Aa and 77Ba disposed between the sides of the memory dies 51A to 54A and 51B to 54B and the first non-central TSV regions 78Aa and 78Ba so as to be close to the processing device 30, second inner bank regions 77Ab and 77Bb disposed between the central TSV regions 76A and 76B and the second non-central TSV regions 78Ab and 78Bb, and third inner bank regions 77Ac and 77Bc disposed between the first non-central TSV regions 78Aa and 78Ba and the second non-central TSV regions 78Ab and 78Bb.

The inner banks 74Aa1*a* to 74Ab4*b* and 74Ba1*a* to 74Bb4*b* may be allocated by dividing each of the outer banks 73Aa, 73Ab, 73Ba and 73Bb into 8 blocks. For example, the 8 inner banks 74Aa1*a* to 74Ab4*b* and 74Ba1*a* to 74Bb4*b* may have the same data storage capacity as one of the outer banks 73Aa, 73Ab, 73Ba and 73Bb.

In accordance with an embodiment of the present disclosure, the inner banks 74Aa1*a* to 74Ab4*b* and 74Ba1*a* to 74Bb4*b* may communicate with the processing device 30 through the non-central TSVs 62A and 62B, and the outer banks 73Aa, 73Ab and 73Ba, 73Bb may communicate with the processing device 30 through the central TSVs 61A and 61B. Accordingly, the inner banks 74Aa1*a* to 74Ab4*b* and 74Ba1*a* to 74Bb4*b* may communicate with the processing device 30 through shorter electrical paths than the outer banks 73Aa, 73Ab and 73Ba, 73Bb. In an embodiment, the electrical paths coupling the inner banks 74Aa1*a* to 74Ab4*b* and 74Ba1*a* to 74Bb4*b* through the non-central TSVs 62Aa and 62Ab and 62Ba and 62Bb from the processing device 30 may be shorter than those coupling the outer banks 73Aa, 73Ab and 73Ba, 73Bb through the central TSVs 61A and 61B from the processing device 30. Therefore, data which are frequently accessed may be stored in the inner banks 74Aa1*a* to 74Ab4*b* and 74Ba1*a* to 74Bb4*b*, and data which are not frequently accessed may be stored in the outer banks 73Aa, 73Ab and 73Ba, 73Bb, such that the semiconductor module 100 can operate efficiently while power consumption is reduced.

Figure 7:
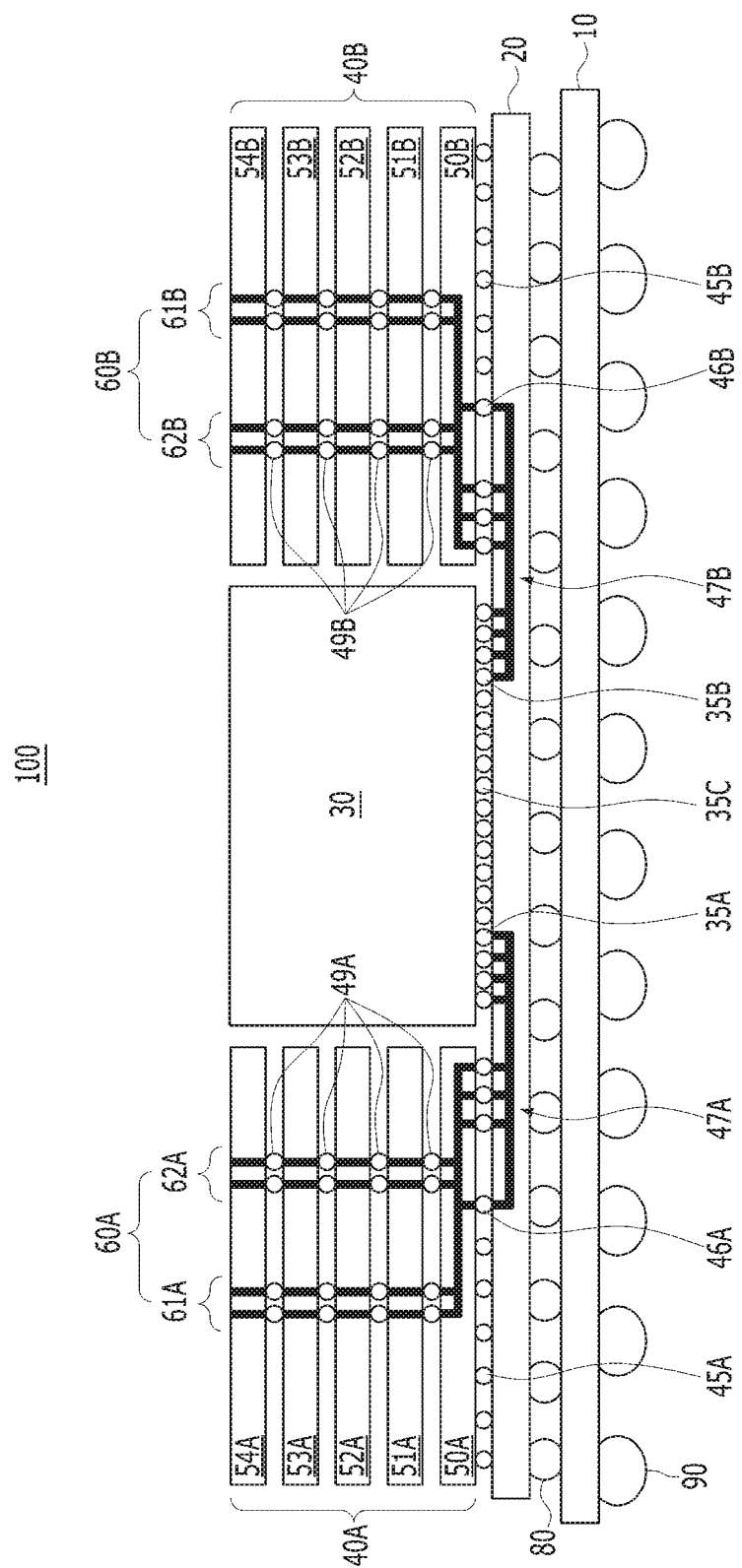
FIG. 7 is a longitudinal sectional view of a schematic illustration of a semiconductor module in accordance with an embodiment of the present disclosure.

FIG. 7 is a longitudinal sectional view of a schematic illustration of a semiconductor module 100 in accordance with an embodiment of the present disclosure. Referring to FIG. 7, the semiconductor module 100 may include a module board 10, an interposer 20 mounted on the module board 10, and a processing device 30 and memory stacks 40A and 40B that are mounted side by side on the interposer 20. The memory stacks 40A and 40B may include base dies 50A and 50B, and a plurality of memory dies 51A to 54A and 51B to 54B stacked on the base dies 50A and 50B, respectively. As compared with the memory stacks 40A and 40B of FIG. 2, the memory stacks 40A and 40B of FIG. 7 may include central TSVs 61A and 61B and non-central TSVs 62A and 62B. The central TSVs 61A and 61B may be disposed close to virtual central lines bisecting the memory stacks 40A and 40B vertically, and the non-central TSVs 62A and 62B may be moved from the virtual central lines to the outside so as to be spaced apart from the virtual central lines. The distances from the processing device 30 to the central TSVs 61A and 61B may be greater than those from the processing device 30 to the non-central TSVs 62A and 62B. In other words, electrical paths from the processing device 30 to the non-central TSVs 62A and 62B may be shorter than those from the processing device 30 to the central TSVs 61A and 61B. Detailed description of the components of the semiconductor module 100 that are not described may be understood with reference to FIG. 2.

Figure 8:
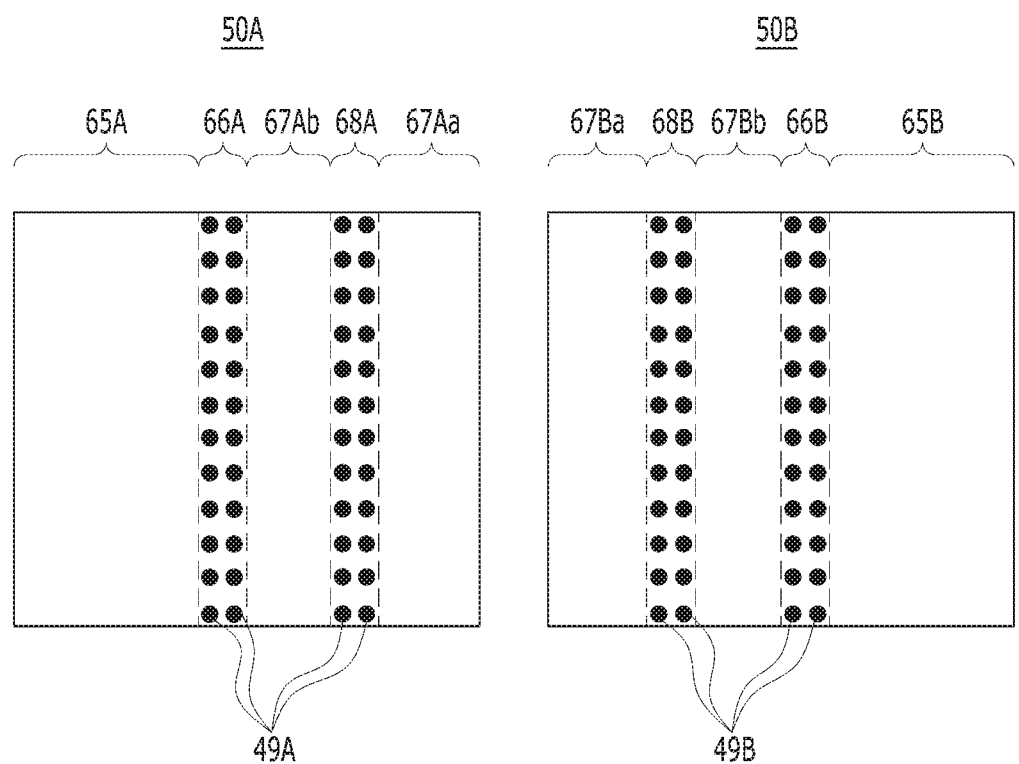
FIG. 8 is a top view of a schematic illustration of base dies in accordance with an embodiment of the present disclosure.

FIG. 8 is a top view of a schematic illustration of the first and second base dies 50A and 50B of the first and second memory stacks 40A and 40B in accordance with the present embodiment. Referring to FIG. 8, the top surfaces of the first and second base dies 50A and 50B may include circuit occupied regions 65A and 65B, central TSV occupied regions 66A and 66B, PHY occupied regions 67Aa, 67Ab and 67Ba, 67Bb, and non-central TSV occupied regions 68A and 68B, respectively.

The central TSV occupied regions 66A and 66B may be disposed adjacent to the respective circuit occupied regions 65A and 65B. In an embodiment, the central TSV occupied regions 66A and 66B may be disposed on or adjacent to virtual central lines bisecting the top surfaces of the first and second base dies 50A and 50B, respectively. The non-central TSV occupied regions 68A and 68B may be spaced apart from the virtual central lines. The non-central TSV occupied regions 68A and 68B may be disposed closer to the processing device 30 than the central TSV occupied regions 66A and 66B. In other words, the distances from the processing device 30 to the central TSV occupied regions 66A and 66B may be greater than those from the processing device 30 to the non-central TSV occupied regions 68A and 68B.

The PHY occupied regions 67Aa, 67Ab and 67Ba, 67Bb may include first PHY occupied regions 67Aa and 67Ba disposed between the sides of the base dies 50A and 50B close to the processing device 30 and the non-central TSV occupied regions 68A and 68B, and second PHY occupied regions 67Ab and 67Bb disposed between the central TSV occupied regions 66A and 66B and the non-central TSV occupied regions 68A and 68B. In other words, the PHY occupied regions 67Aa, 67Ab and 67Ba, 67Bb may be disposed separately on both sides of the non-central TSV occupied regions 68A and 68B, respectively.

Figure 9A:
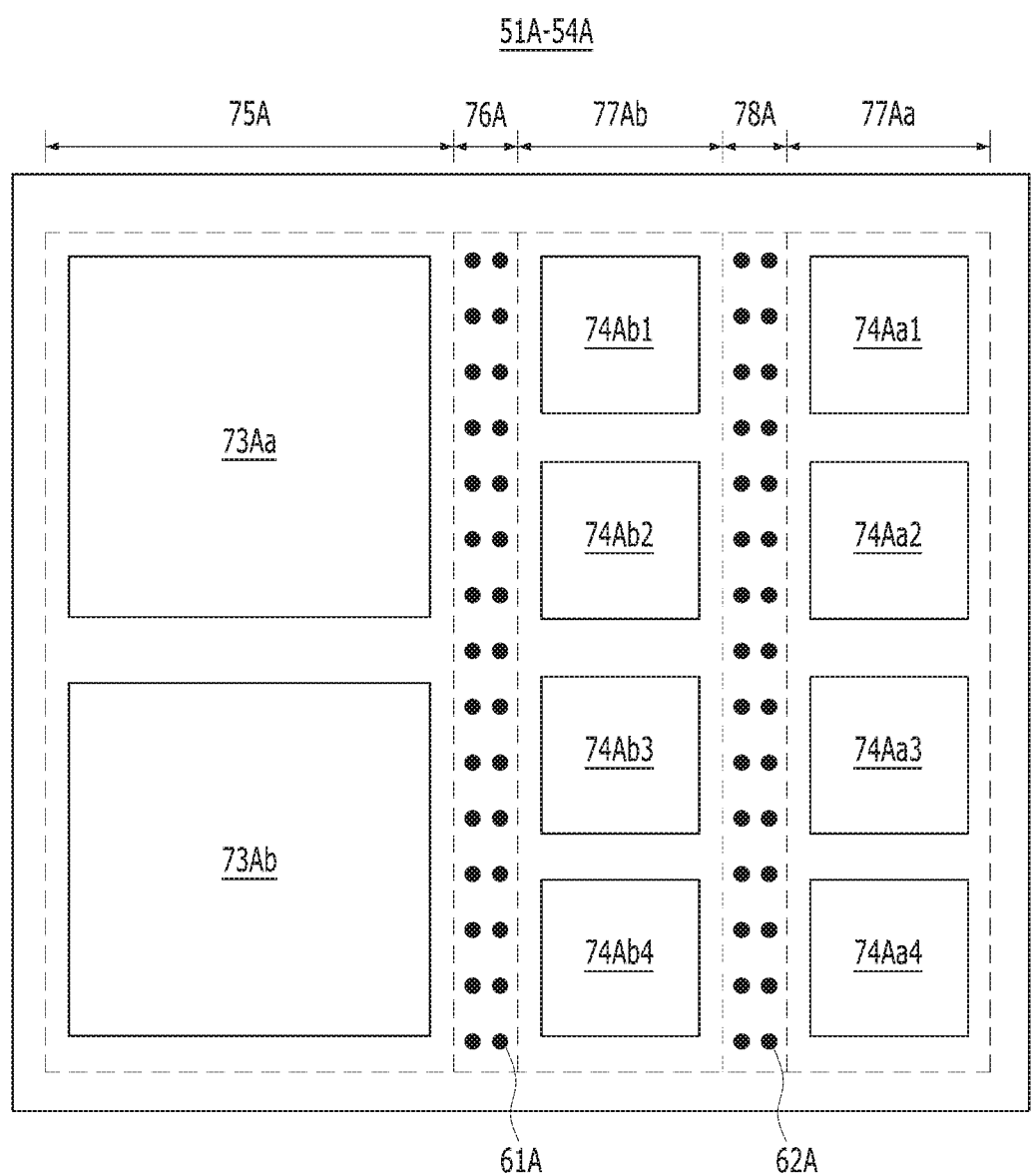
FIGS. 9A and 9B are internal block layouts of memory dies shown in FIG. 7.
Figure 9B:
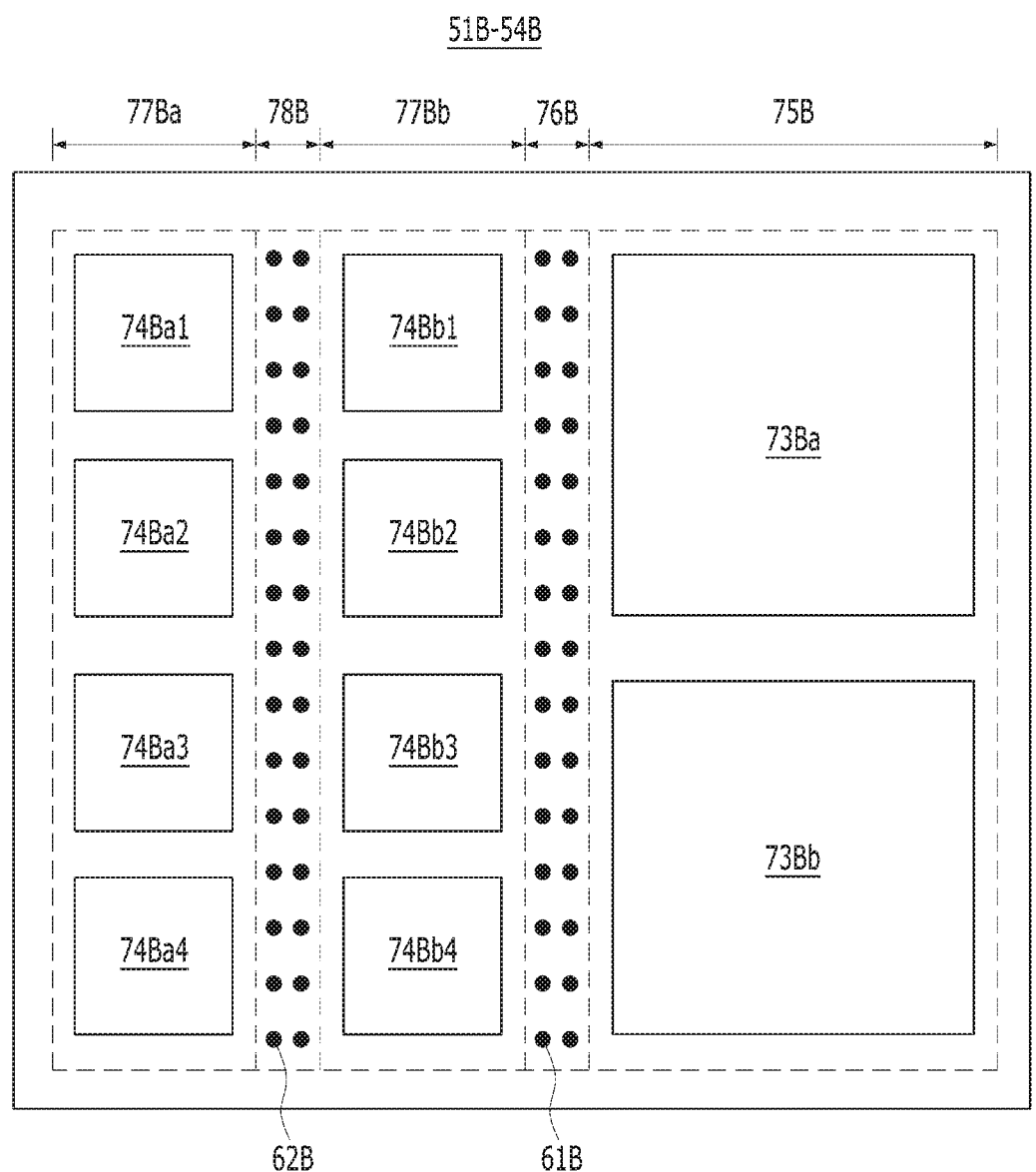

FIGS. 9A and 9B are internal block layouts of the memory dies 51A to 54A and 51B to 54B shown in FIG. 7. Referring to FIGS. 9A and 9B, the memory dies 51A to 54A and 51B to 54B may include outer bank regions 75A and 75B overlapping the circuit occupied regions 65A and 65B of the base dies 50A and 50B, central TSV regions 76A and 76B overlapping the central TSV occupied regions 66A and 66B, inner bank regions 77Aa, 77Ab and 77Ba, 77Bb overlapping the PHY occupied regions 67Aa, 67Ab and 67Ba, 67Bb, and non-central TSV regions 78A and 78B overlapping the non-central TSV occupied regions 68A and 68B, respectively.

Outer banks 73Aa, 73Ab and 73Ba, 73Bb may be disposed in the outer bank regions 75A and 75B, respectively. The central TSVs 61A and 61B may be disposed in the central TSV regions 76A and 76B. The outer banks 73Aa, 73Ab and 73Ba, 73Bb may communicate with an external device through the central TSVs 61A and 61B.

Inner banks 74Aa1 to 74Ab4 and 74Ba1 to 74Bb4 may be disposed in the inner bank regions 77Aa, 77Ab and 77Ba, 77Bb. The inner banks 74Aa1 to 74Ab4 and 74Ba1 to 74Bb4 may share the non-central TSVs 62A and 62B, respectively.

The inner banks 74Aa1 to 74Ab4 and 74Ba1 to 74Bb4 may be allocated by dividing each of the outer banks 73Aa, 73Ab and 73Ba, 73Bb into 4 blocks, respectively. For example, the 4 inner banks 74Aa1 to 74Aa4 may form the outer bank 73Aa, the 4 inner banks 74Ab1 to 74Ab4 may form the outer bank 73Ab, the 4 inner banks 74Ba1 to 74Ba4 may form the outer bank 73Ba, and the 4 inner banks 74Bb1 to 74Bb4 may form the outer bank 73Bb.

In accordance with the present embodiment, the inner banks 74Aa1 to 74Ab4 and 74Ba1 to 74Bb4 may communicate with the processing device 30 through the non-central TSVs 62A and 62B, and the outer banks 73Aa, 73Ab and 73Ba, 73Bb may communicate with the processing device 30 through the central TSVs 61A and 61B.

The electrical paths coupling the inner banks 74Aa1 to 74Ab4 and 74Ba1 to 74Bb4 through the non-central TSVs 62A and 62B from the processing device 30 may be shorter than those coupling the outer banks 73Aa, 73Ab and 73Ba, 73Bb through the central TSVs 61A and 61B from the processing device 30.

Figure 10:
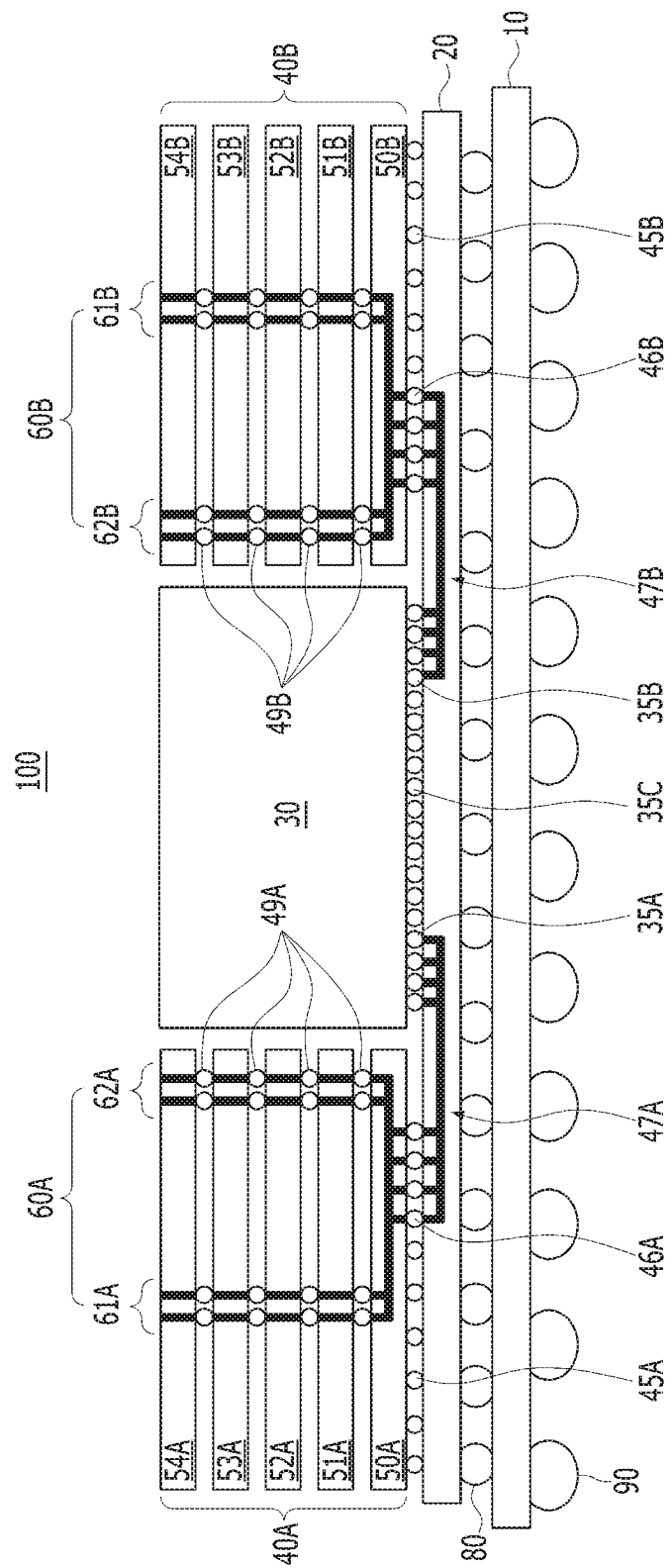
FIG. 10 is a longitudinal sectional view of a schematic illustration of a semiconductor module in accordance with an embodiment of the present disclosure.

FIG. 10 is a longitudinal sectional view of a schematic illustration of a semiconductor module 100 in accordance with an embodiment of the present disclosure. Referring to FIG. 10, the semiconductor module 100 may include a module board 10, an interposer 20 mounted on the module board 10, and a processing device 30 and memory stacks 40A and 40B that are mounted side by side on the interposer 20. The memory stacks 40A and 40B may include base dies 50A and 50B and a plurality of memory dies 51A to 54A and 51B to 54B stacked on the base dies 50A and 50B, respectively. As compared with the memory stacks of FIGS. 2 and 7, the memory stacks 40A and 40B of FIG. 10 may include central TSVs 61A and 61B and non-central TSVs 62A and 62B. The central TSVs 61A and 61B may be disposed close to central regions of the memory stacks 40A and 40B, respectively. The non-central TSVs 62A and 62B may be disposed closer to the sides of the memory stacks 40A and 40B, respectively, than the non-central TSVs 62A and 62B of FIGS. 2 and 7. Detailed description of the components of the semiconductor module 100 that are not described may be understood with reference to FIG. 2.

Figure 11:
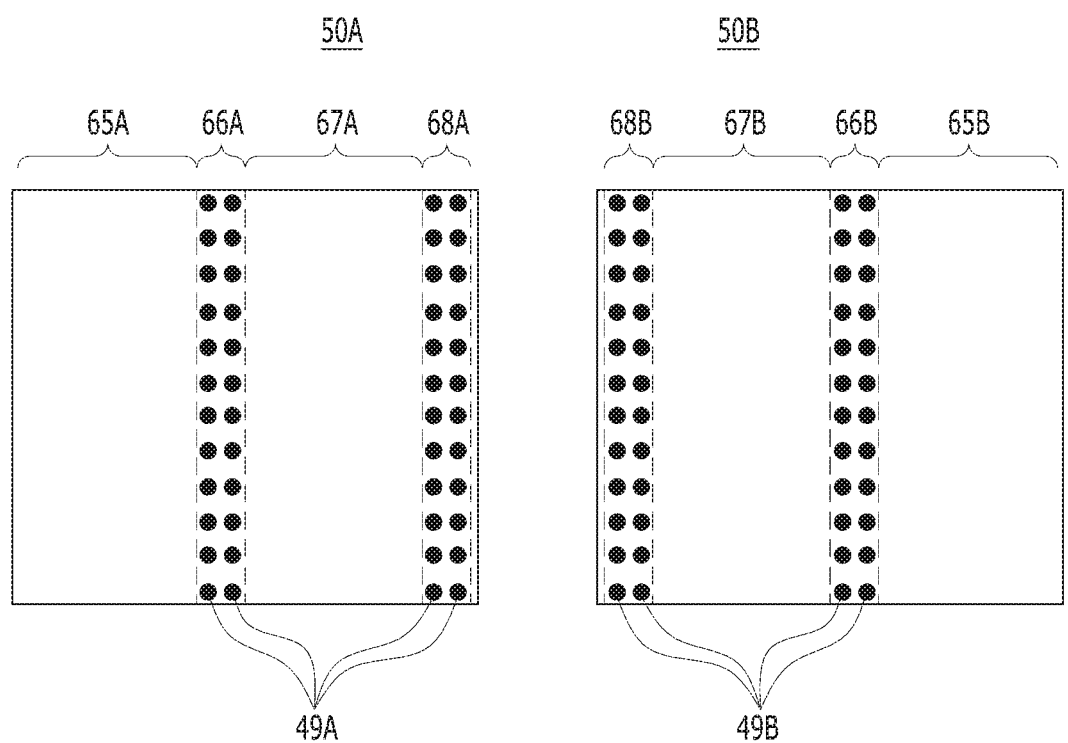
FIG. 11 is a top view of a schematic illustration of base dies in accordance with an embodiment of the present disclosure.

FIG. 11 is a top view of a schematic illustration of the first and second base dies 50A and 50B of the first and second memory stacks 40A and 40B in accordance with the present embodiment. Referring to FIG. 11, the top surfaces of the first and second base dies 50A and 50B may include circuit occupied regions 65A and 65B, central TSV occupied regions 66A and 66B, PHY occupied regions 67A and 67B, and non-central TSV occupied regions 68A and 68B, respectively. The central TSV occupied regions 66A and 66b may be disposed adjacent the respective circuit occupied regions 65A and 65B. In an embodiment, the central TSV occupied regions 66A and 66B may be disposed on or adjacent to virtual central lines bisecting the top surfaces of the first and second base dies 50A and 50B, respectively. The non-central TSV occupied regions 68A and 68B may be disposed adjacent to the sides of the first and second base dies 50A and 50B, respectively. The non-central TSV occupied regions 68A and 68B may be disposed closer to the processing device 30 than the central TSV occupied regions 66A and 66B. In other words, the distances from the processing device 30 to the central TSV occupied regions 66A and 66B may be greater than those from the processing device 30 to the non-central TSV occupied regions 68A and 68B. The PHY occupied regions 67A and 67B may be disposed between the central TSV occupied regions 66A and 66B and the non-central TSV occupied regions 68A and 68B, respectively. Further referring to FIG. 8, TSVs or inter-die micro-bumps 49A and 49B may be disposed adjacent to one another in the non-central TSV occupied regions 68A and 68B. Accordingly, the PHY occupied regions 67A and 67B may be disposed between the non-central TSV occupied regions 68A and 68B and the central TSV occupied regions 66A and 66B.

Figure 12A:
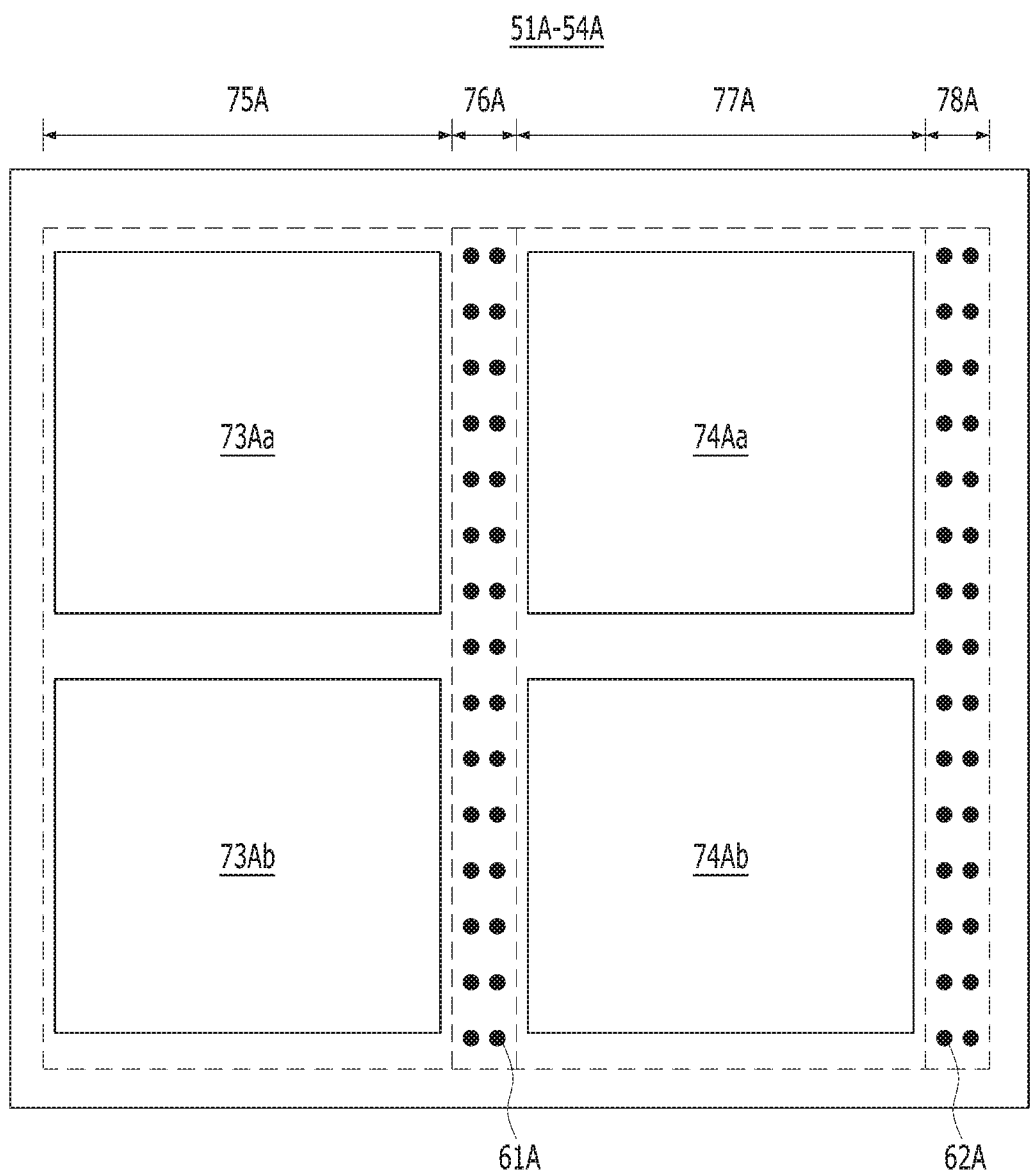
FIGS. 12A and 12B are internal block layouts of memory dies shown in FIG. 10.
Figure 12B:
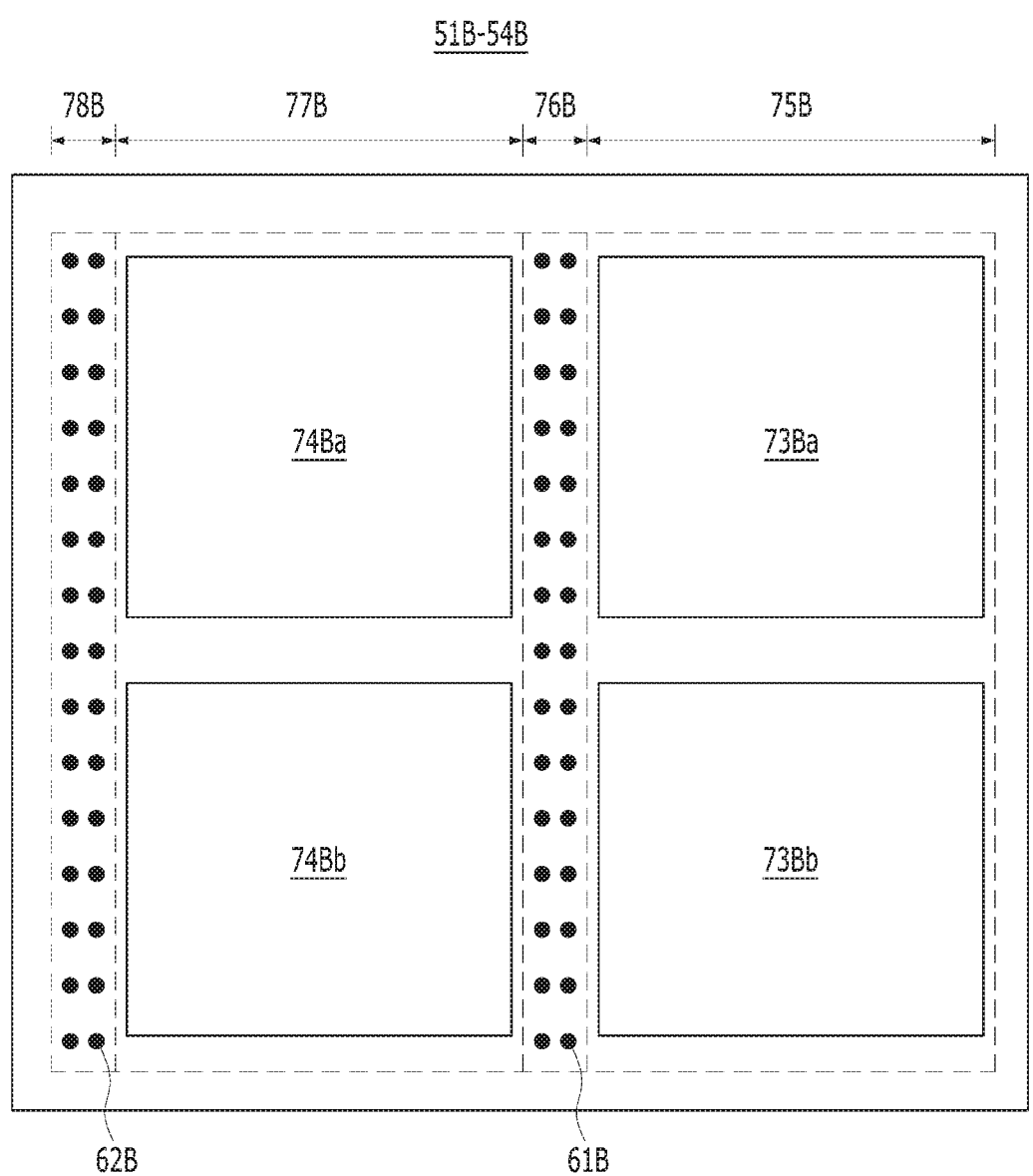

FIGS. 12A and 12B are internal block layouts of the memory dies 51A to 54A and 51B to 54B shown in FIG. 10. Referring to FIGS. 12A and 12B, the memory dies 51A to 54A and 51B to 54B may include outer bank regions 75A and 75B overlapping the circuit occupied regions 65A and 65B of the base dies 50A and 50B of FIG. 11, central TSV regions 76A and 76B overlapping the central TSV occupied regions 66A and 66B, inner bank regions 77A and 77B overlapping the PHY occupied regions 67A and 67B, and non-central TSV regions 78A and 78B overlapping the non-central TSV occupied regions 68A and 68B, respectively.

Outer banks 73Aa, 73Ab and 73Ba, 73Bb may be disposed in the outer bank regions 75A and 75B, respectively. The central TSVs 61A and 61B may be disposed in the central TSV regions 76A and 76B. The outer banks 73Aa, 73Ab and 73Ba, 73Bb may communicate with an external device through the central TSVs 61A and 61B.

Inner banks 74Aa, 74Ab and 74Ba, 74Bb may be disposed in the inner bank regions 77A and 77B. The inner banks 74Aa, 74Ab and 74Ba, 74Bb may share the non-central TSVs 62A and 62B, respectively.

In accordance with the present embodiment, the inner banks 74Aa, 74Ab and 74Ba, 74Bb may communicate with the processing device 30 through the non-central TSVs 62A and 62B, and the outer banks 73Aa, 73Ab and 73Ba, 73Bb may communicate with the processing device 30 through the central TSVs 61A and 61B.

The electrical paths coupling the inner banks 74Aa, 74Ab and 74Ba, 74Bb through the non-central TSVs 62A and 62B from the processing device 30 may be shorter than those coupling the outer banks 73Aa, 73Ab and 73Ba, 73Bb through the central TSVs 61A and 61B from the processing device 30.

While the present disclosure has been described with respect to the specific embodiments, it should be noted that the embodiments are for describing, not limiting, the present disclosure. Further, it should be noted that the present disclosure may be achieved in various ways through substitution, change, and modification, by those skilled in the art without departing from the scope of the present disclosure as defined by the following claims.

What is claimed is:

1. A semiconductor module comprising:
a processing device and a memory stack operatively coupled to one another and to a module board,
wherein the memory stack includes a base die and a memory die on the base die,
wherein the memory die includes an outer bank region, a central TSV region, first and second inner bank regions, and
a first non-central TSV region, and
wherein the central TSV region is disposed between the outer bank region and the second inner bank region, and the first non-central TSV region is disposed between the first inner bank region and the second inner bank region.

2. The semiconductor module of claim 1, wherein:
the first inner bank region is disposed adjacent to a side of the memory die,
the second inner bank region is disposed adjacent to the central TSV region.

3. The semiconductor module of claim 1, wherein:
the memory die further includes a second non-central TSV region and a third inner bank region which are disposed between the second inner bank region and the first non-central TSV region,
the second non-central TSV region is disposed adjacent to the second inner bank region, and the third inner bank region is disposed adjacent to the first non-central TSV region.

4. The semiconductor module of claim 3, wherein an electrical path from the processing device to the first non-central TSV region is shorter than an electrical path from the processing device to the second non-central TSV region.

5. The semiconductor module of claim 1, wherein an electrical path from the processing device to the central TSV region is longer than an electrical path from the processing device to the first non-central TSV region.

6. The semiconductor module of claim 1, wherein the central TSV region is adjacent to the outer bank region and the outer bank region is adjacent to a side of the memory die.

7. The semiconductor module of claim 1, further comprising an interposer mounted on the module board,
wherein the processing device and the memory stack are positioned side by side on the interposer.

8. The semiconductor module of claim 1, wherein the base die includes:
a circuit occupied region;
a central TSV occupied region;
first and second PHY occupied regions; and
a first non-central TSV occupied region,
wherein the central TSV occupied region is disposed between the circuit occupied region and the second PHY occupied region, and the first non-central TSV occupied region is disposed between the first PHY occupied region and the second PHY occupied region.

9. The semiconductor module of claim 8,
wherein the memory stack includes a central TSV and a first non-central TSV which vertically penetrate the memory die,
wherein:
the central TSV occupied region, the central TSV region and the central TSV vertically overlap one another, and
the first non-central TSV occupied region, the first non-central TSV region and the first non-central TSV vertically overlap one another.

10. A semiconductor module comprising:
a processing device and a memory stack operatively coupled to one another,
wherein the memory stack includes:
a plurality of memory dies stacked on a base die; and
a plurality of TSVs penetrating the memory dies,
wherein the base die includes a circuit occupied region, a central TSV occupied region, a non-central TSV occupied region and a PHY occupied region,
wherein a first distance from the processing device to the circuit occupied region is longer than a second distance from the processing device to the central TSV occupied region,
a third distance from the processing device to the non-central TSV occupied region is shorter than the second distance, and
a fourth distance from the processing device to the PHY occupied region is shorter than the second distance and greater than the third distance.

11. The semiconductor module of claim 10, wherein each of the memory dies includes:
a central TSV region vertically overlapping the central TSV occupied region; and
a non-central TSV region vertically overlapping the non-central TSV occupied region.

12. The semiconductor module of claim 11, wherein each of the memory dies further includes:
an outer bank region including an outer bank that vertically overlaps the circuit occupied region; and
an inner bank region including an inner bank that vertically overlaps the PHY occupied region.

13. The semiconductor module of claim 12, wherein the memory stack includes central TSVs disposed in the central TSV region and non-central TSVs disposed in the non-central TSV region,
wherein the central and non-central TSVs vertically penetrate the base die and the memory dies.

14. The semiconductor module of claim 13, wherein a first electrical path that is electrically coupled to the outer bank through the central TSVs from the processing device is longer than a second electrical path that is electrically coupled to the inner bank through the non-central TSVs from the processing device.

15. The semiconductor module of claim 10, further comprising a module board and an interposer,
wherein the processing device and the memory stack are positioned side by side on the interposer,
wherein the interposer includes a processor mounting region in which the processing device is mounted and a memory stack mounting region in which the memory stack is mounted, and
wherein the memory stack mounting region includes an inner memory ball grid array and an outer memory ball grid array, and a distance from the processor mounting region to the inner memory ball grid array is greater than a distance from the processor mounting region to the outer memory ball grid array.

16. The semiconductor module of claim 15, wherein the inner memory ball grid array vertically overlaps the PHY occupied region, and the outer memory ball grid array vertically overlaps the circuit occupied region.

17. A semiconductor module comprising:
a processing device and a memory stack operatively coupled to one another,
wherein the memory stack includes a base die, memory dies stacked on the base die, and central and non-central TSVs that vertically penetrate the memory dies,
wherein at least one of the memory dies includes outer and inner banks, and a first electrical path that is electrically coupled to the outer bank through the central TSV from the processing device is longer than a second electrical path that is electrically coupled to the inner bank through the non-central TSV from the processing device.

18. The semiconductor module of claim 17,
wherein the central TSV is disposed between the outer bank and the inner bank,
wherein the inner bank is disposed between the central TSV and the non-central TSV.

19. The semiconductor module of claim 18,
wherein the central TSV is disposed adjacent to a virtual central line bisecting the memory dies, and
the non-central TSV is spaced apart from the virtual central line so as to be disposed relatively close to the processing device.

20. The semiconductor module of claim 18, wherein the inner bank includes a first inner bank disposed between the non-central TSV and the processing device, and a second inner bank disposed between the central TSV and the non-central TSV.

21. The semiconductor module of claim 20, wherein an electrical path that is coupled to the first inner bank through the non-central TSV from the processing device is shorter than an electrical path that is coupled to the second inner bank through the non-central TSV from the processing device.

22. The semiconductor module of claim 21, wherein an electrical path that is coupled to the first inner bank through the non-central TSV from the processing device has the same distance as an electrical path that is coupled to the second inner bank through the non-central TSV from the processing device.

23. A semiconductor module comprising:
a memory stack including a base die, a plurality of memory dies stacked on the base die, at least one central TSV and at least one non-central TSV penetrating the memory dies,
wherein each of the memory dies includes an outer bank and at least one inner bank, and
a processing device operatively coupled to the memory stack via a first electrical path to the outer bank and to the inner bank of each memory die and to the at least one inner bank via a second electrical path,
wherein the first electrical path includes the at least one central TSV, and
wherein the second electrical path includes the at least one non-central TSV.

24. The semiconductor module of claim 23,
wherein the first electrical path is shorter than the second electrical path.

25. The semiconductor module of claim 23,
wherein the first electrical path is used for processing a first group of data having a common characteristic and the second electrical path is used for all other data.

26. The semiconductor module of claim 23,
wherein the at least one central TSV is disposed between the outer bank and the inner bank, and
wherein the inner bank is disposed between the at least one central TSV and the at least one non-central TSV.

27. The semiconductor module of claim 23,
wherein the central TSV is disposed adjacent to a virtual central line bisecting the memory dies, and
the non-central TSV is spaced apart from the virtual central line so as to be disposed closer to the processing device than the central TSV.

* * * * *